(12) United States Patent
Tsuda et al.

(10) Patent No.: US 6,815,728 B2
(45) Date of Patent: Nov. 9, 2004

(54) NITRIDE SEMICONDUCTOR LIGHT-EMITTING DEVICE AND OPTICAL DEVICE AND LIGHT-EMITTING APPARATUS WITH THE NITRIDE SEMICONDUCTOR LIGHT-EMITTING DEVICE

(75) Inventors: Yuhzoh Tsuda, Nara (JP); Shigetoshi Ito, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 26 days.

(21) Appl. No.: 10/126,264

(22) Filed: Apr. 19, 2002

(65) Prior Publication Data
US 2003/0001168 A1 Jan. 2, 2003

(30) Foreign Application Priority Data
Apr. 19, 2001 (JP) .......................................... 2001-121309

(51) Int. Cl.$^7$ .......................... H01L 29/06; H01L 33/00
(52) U.S. Cl. ............................. 257/98; 257/14; 257/17; 257/91; 257/95; 257/103
(58) Field of Search ............................. 257/14, 17, 22, 257/91, 98, 99, 103, 12, 13, 24, 96, 92, 95

(56) References Cited
U.S. PATENT DOCUMENTS
6,288,416 B1 * 9/2001 Koike et al. ................. 257/94
6,472,679 B1 * 10/2002 Takayama et al. ............. 257/12
6,542,526 B1 * 4/2003 Niwa et al. .................... 372/45

FOREIGN PATENT DOCUMENTS
JP          10270804 A    10/1998

* cited by examiner

Primary Examiner—Minhloan Tran
Assistant Examiner—Tan Tran
(74) Attorney, Agent, or Firm—Morrison & Foerster LLP (57) ABSTRACT

A light-emitting device has a light-emitting layer of nitride semiconductor containing As, P or Sb and accordingly its emission efficiency or emission intensity is enhanced. The light-emitting device includes a substrate, and further includes n-type and p-type nitride semiconductor layers and a light-emitting layer between the n-type and p-type semiconductor layers that are formed on the substrate. Light-emitting layer includes one or a plurality of well layers formed of nitride semiconductor containing N and element X (element X is As, P or Sb). The nitride semiconductor of the well layer has at most 30% in atomic percent represented by expression $\{N_X/(N_N+N_X)\}\times 100$ where $N_X$ represents the number of atoms of element X and $N_N$ represents the number of atoms of N. The thickness of the well layer ranges from 0.4 nm to 4.8 nm.

10 Claims, 7 Drawing Sheets

NITRIDE SEMICONDUCTOR LIGHT-EMITTING DEVICE AND OPTICAL DEVICE AND LIGHT-EMITTING APPARATUS WITH THE NITRIDE SEMICONDUCTOR LIGHT-EMITTING DEVICE

BACKGROUND OF THE INVENTION

1. Field of the Invention

The present invention relates to a nitride semiconductor light-emitting device as well as an optical device and a light-emitting apparatus that use the nitride semiconductor light-emitting device. In particular, the present invention relates to a nitride semiconductor light-emitting device having a high emission efficiency and to an optical device and a light-emitting apparatus with that nitride semiconductor light-emitting device.

2. Description of the Background Art

Group V element such as As, P or Sb is added to gallium nitride-based compound semiconductor. Then, a resultant mixed crystal exhibits a great change in the bandgap with respect to a small change in the lattice constant. In consideration of this phenomenon, the amount of As, P or Sb to be added to the gallium nitride-based compound semiconductor, which constitutes a light-emitting layer, can be varied to change the emission wavelength. For example, Japanese Patent Laying-Open No. 10-270804 discloses a semiconductor laser device having, on an a-plane sapphire substrate, a non-doped $GaN_{0.94}As_{0.06}$—GaN strained quantum well active layer (each thickness: 5 nm, 3 cycles), and a semiconductor laser device having, on an a-plane sapphire substrate, a non-doped $GaN_{0.97}As_{0.03}$—GaN strained quantum well active layer (each thickness: 5 nm, 5 cycles).

For the light-emitting layer constituted of a GaNAs crystal, GaNP crystal or GaNSb crystal, the effective mass of electrons and holes can be decreased relative to conventional InGaN crystals. This suggests that the low carrier density can produce population inversion for a lasing action (decrease in the lasing threshold current value). However, if As for example is added to a light-emitting layer constituted of nitride semiconductor, it is highly likely that the resultant light-emitting layer is separated into a region with a high nitrogen concentration and a region with a high As concentration (this phenomenon is hereinafter referred to as "concentration separation"). Moreover, the light-emitting layer could be separated into different crystal systems, i.e., hexagonal system in the region of the high nitride concentration and cubic system in the region of the high As concentration (hereinafter referred to as "crystal system separation"). Such a separation into different crystal systems causes decrease in the emission efficiency due to the deteriorated crystallinity. The crystal system separation could be caused not only by As but also by P or Sb added to the nitride semiconductor light-emitting layer. It is thus desired to avoid the crystal system separation for enhancing the emission efficiency (emission intensity).

SUMMARY OF THE INVENTION

One object of the present invention is to clarify a structure of a light-emitting device that can improve the performance of the light-emitting device which includes a light-emitting layer constituted of nitride semiconductor containing at least one of As, P and Sb, and to provide the light-emitting device that has thus an enhanced emission efficiency or emission intensity or has a lower threshold current density.

A nitride semiconductor light-emitting device according to the present invention includes a substrate, an n-type nitride semiconductor layer and a p-type nitride semiconductor layer formed on the substrate, and one or a plurality of well layers provided between the n-type nitride semiconductor layer and the p-type nitride semiconductor layer. The well layer is constituted of nitride semiconductor containing at least N and element X including at least one element selected from the group consisting of As, P and Sb. The nitride semiconductor of the well layer has at most 30% in atomic percent represented by expression $\{N_X/(N_N+N_X)\} \times 100$ where $N_X$ represents the number of atoms of element X and $N_N$ represents the number of atoms of N. The well layer has a thickness ranging from 0.4 nm to 4.8 nm. This composition and thickness of the well layer can reduce the threshold current density or enhance the emission intensity.

For the light-emitting device according to the present invention, preferably the well layer contains at least one element selected from the group consisting of Si, O, S, C, Ge, Zn, Cd and Mg in a concentration ranging from $1\times10^{17}/cm^3$ to $1\times10^{19}/cm^3$. Such impurity elements can be added to improve the crystallinity of the well layer and to further decrease the threshold current density or further enhance the emission intensity.

The light-emitting device according to the present invention typically includes a barrier layer contacting the well layer. Preferably the barrier layer has a thickness ranging from 3 nm to 20 nm. The barrier layer with such a thickness can prevent slight crystal system separation occurring in the well layer from propagating to other well layers.

The light-emitting device according to the present invention includes one or a plurality of well layers. Preferably, the number of the well layers is at most 8. The nitride semiconductor light-emitting device including an appropriate number of well layers can further be reduced in the threshold current density or increased in the emission intensity.

For the nitride semiconductor light-emitting device according to the present invention, preferably the substrate is a nitride semiconductor substrate or pseudo nitride semiconductor substrate detailed below.

The nitride semiconductor substrate can be used for the light-emitting device of the present invention in order to lessen crystal system separation which could occur in the well layer. Here, the nitride semiconductor substrate refers to a substrate made of nitride semiconductor and having a thickness suitable as the one on which components of the device are deposited. The nitride semiconductor substrate includes a substrate which is formed of nitride semiconductor crystals produced by various crystal growth methods and processed into an appropriate size, as well as a substrate formed by growing a nitride semiconductor crystal layer on another crystal material and then removing this another crystal material. Typically, the nitride semiconductor substrate is a substrate constituted of at least $Al_xGa_yIn_zN$ ($0 \leq x \leq 1$, $0 \leq y \leq 1$, $0 \leq z \leq 1$, x+y+z=1). In the nitride semiconductor substrate, approximately 10% or less of nitrogen constituting the nitride semiconductor substrate may be substituted with at least one of As, P and Sb to the degree that the crystal shape of hexagonal system is maintained. In addition, at least one of impurity elements Si, O, Cl, S, C, Ge, Zn, Cd, Mg and Be may be added to the nitride semiconductor substrate. In particular, for the purpose of providing n-type conductivity to the nitride semiconductor substrate, preferably any of Si, O and Cl among the impurity elements is added in an amount ranging from $3\times10^{17}/cm^3$ to $1\times10^{19}/cm^3$.

Figure 2:
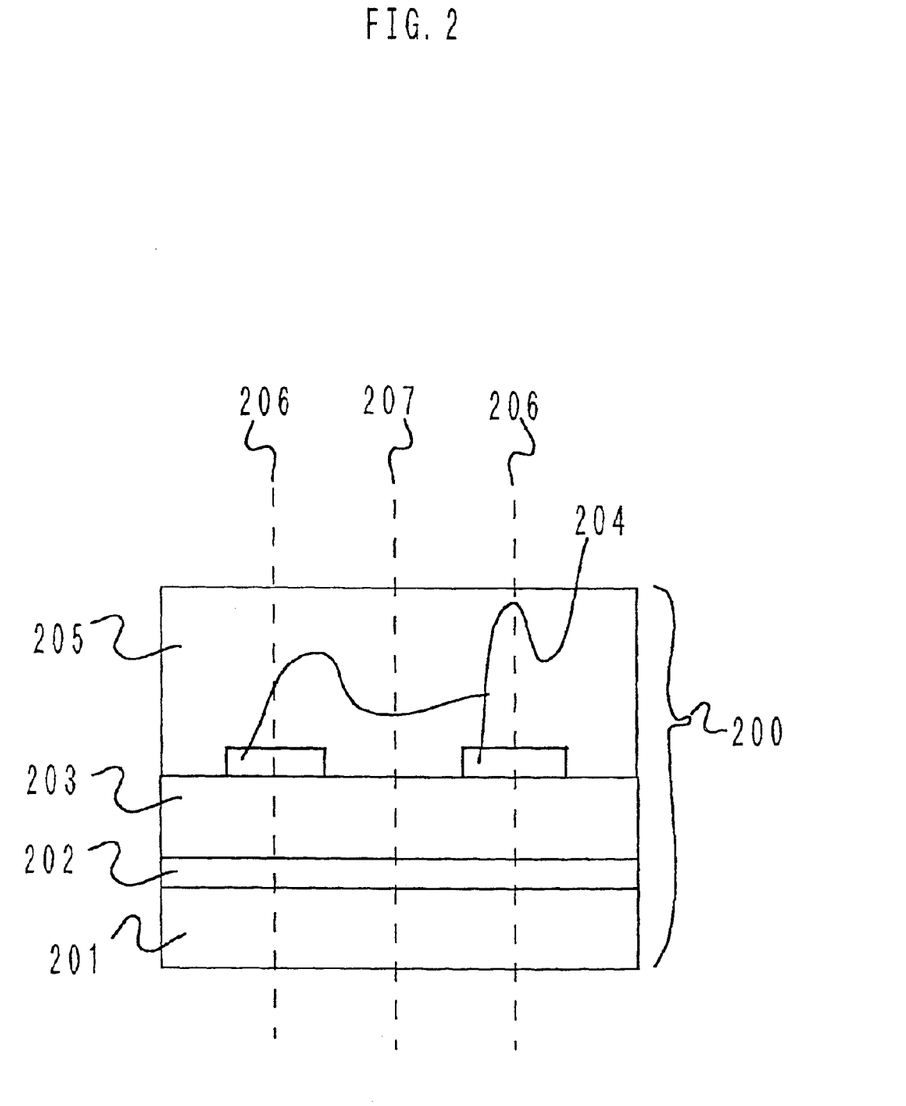
FIG. 2 schematically shows a cross section of an exemplary pseudo GaN substrate.
Figure 3A:
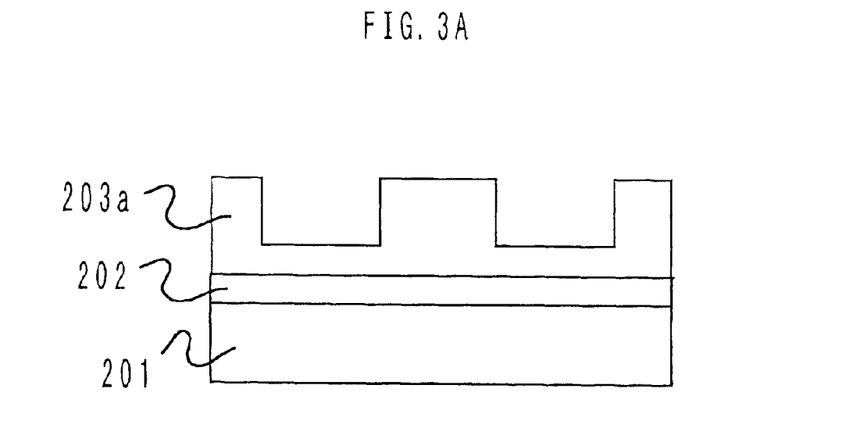
FIGS. 3A and 3B schematically show a cross section of another exemplary pseudo GaN substrate, FIG. 3A illustrating an etching process of the pseudo GaN substrate and FIG. 3B illustrating the completed GaN substrate.

The pseudo nitride semiconductor substrate herein refers to a substrate structured by growing a nitride semiconductor crystal layer on another crystal material. Typically the nitride semiconductor is represented by $Al_xGa_yIn_zN$ ($0 \leq x \leq 1$, $0 \leq y \leq 1$, $0 \leq z \leq 1$, $x+y+z=1$). A particularly preferable nitride semiconductor is GaN. The pseudo nitride semiconductor substrate, particularly pseudo GaN substrate can be used to lessen crystal system separation which could occur in the well layer. The pseudo nitride semiconductor substrate includes a pseudo GaN substrate as shown in FIG. 2 and a pseudo GaN substrate as shown in FIG. 3A, for example, that are described below. The former pseudo GaN substrate is constituted of at least a nitride semiconductor crystal layer, a seed substrate on which the nitride semiconductor crystal layer is grown, and an anti-growth layer on which the nitride semiconductor crystal layer is not directly grown. The latter pseudo GaN layer is formed by etching a substrate or nitride semiconductor layer to form trenches therein and thereafter covering the trenches with a nitride semiconductor crystal layer.

The light-emitting device according to the present invention typically includes a light-emitting layer formed of a well layer or a light-emitting layer formed of a well layer and a barrier layer contacting the well layer. For example, if the light-emitting layer has a single quantum well structure, the light-emitting layer is constituted of a well layer only or constituted of a structure: barrier layer/well layer/barrier layer. If the light-emitting layer has a multiple quantum well structure, the light-emitting layer is constituted of a structure: barrier layer/well layer/barrier layer . . . /well layer/barrier layer, or well layer/barrier layer/well layer . . . barrier layer/well layer/barrier layer. Here, the bandgap energy of the well layer is smaller than the bandgap energy of the barrier layer.

Further, according to the present invention, an optical device or a light-emitting apparatus including the above-discussed nitride semiconductor light-emitting device is provided.

It is noted that an atomic percent (%) represented by expression $\{N_X/(N_N+N_X)\} \times 100$, where $N_X$ represents the number of atoms of element X and $N_N$ represents the number of atoms of N, is herein referred to as "atomic percent of element X."

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<Significance of the Well-Layer Thickness of the Present Invention>

According to the present invention, a well layer having an atomic percent of element X that is 30% or less and having a thickness ranging from 0.4 nm to 4.8 nm can be used to lower the threshold current density (by approximately 6% for example) or increase the emission intensity (by approximately 20% at maximum). A thickness of the well layer that is smaller than 0.4 nm increases, to an excessive degree, the carrier confinement level accomplished by the quantum well effect, resulting in decrease in the emission efficiency, and thus such a thickness is not preferable. Further, a thickness of the well layer that is greater than 4.8 nm increases the threshold current density of the nitride semiconductor light-emitting device or causes the emission intensity to start decreasing, and thus such a thickness is not preferable. The reason why the emission intensity starts decreasing when the well layer has a thickness greater than 4.8 nm is uncertain. One possible reason, however, is that, concentration separation of element X could occur in the well layer even if the atomic percent of element X in the well layer is 30% or lower, the region where the concentration separation occurs gradually expands as the thickness of the well layer increases and, finally, the different concentrations of element X in the same well layer increases to such a degree that the characteristics of the light-emitting device are adversely affected. Another possible reason is that, a very small region where crystal system separation occurs is generated in the well layer, the region of crystal system separation expands as the thickness of the well layer increases and, finally the crystal system separation advances to such a degree that the characteristics of the light-emitting device are adversely affected. Here, concentration separation refers to a state that the well layer includes both of a region of a high concentration of element X and a region of a low concentration of element X. Crystal system separation refers to a state that element X contained in the well layer causes two crystal systems, i.e., cubic system and hexagonal system within the well layer.

There is no or only a little adverse influence on the characteristics of the light-emitting device when the presence of element X causes the crystal system separation and the concentration separation to just a small extent. The concentration separation to a certain degree serves to enhance the characteristics of the light-emitting device. However, the concentration separation and crystal system separation to an excessive degree could deteriorate the characteristics of the light-emitting device. Accordingly, the thickness, according to the present invention, of the well layer containing element X is preferable in view of the above-described considerations.

More preferably, the thickness of the well layer containing element X according to the present invention ranges from 2 nm to 4.8 nm. A thickness of 2 nm or more of the well layer is preferable since element X causes concentration separation to such a degree that the characteristics of the nitride semiconductor light-emitting device are improved.

In particular, when the light-emitting layer of the light-emitting device according to the present invention includes a GaN barrier layer, there is a significant influence caused by the thickness of the well layer. In this case, the light-emitting layer specifically has a structure: GaNAs well layer/GaN barrier layer, GaNP well layer/GaN barrier layer, GaNAsP well layer/GaN barrier layer, InGaNAs well layer/GaN barrier layer, InGaP well layer/GaN barrier layer, or InGaNAsP well layer/GaN barrier layer. Although it is uncertain why the thickness of the well layer has a significant influence on this structure of the light-emitting layer, one possible reason is that, when the GaN barrier layer is used, the steepness of the interface between the well layer and the GaN barrier layer is likely to be impaired not only due to the thickness of the well layer but also due to the concentration separation of element X, as compared with the case in which other barrier layers are employed.

<Amount of Element X Added to the Well Layer of the Present Invention>

According to the present invention, the atomic percent of element X is 30% or lower or preferably 15% or lower. Here, element X is at least one element selected from the group consisting of As, P and Sb. The atomic percent of element X that is higher than 15% gradually increases the degree of concentration separation, i.e., gradually increases the difference in respective concentrations of element X in respective regions within the well layer. Moreover, the atomic percent of element X that is higher than 30% starts to change the separation state from the concentration separation to the crystal system separation. When the region where the crystal system separation occurs within the well layer occupies at least approximately 50% of the entire area of the well layer, characteristics of the nitride semiconductor light-emitting device containing element X are considerably deteriorated. For example, if the light-emitting layer has the multiple quantum well structure, such a crystal system separation significantly impairs the steepness of the interface between the well layer and the barrier layer, resulting in increase of the emission half-width (higher color nonuniformity of the light-emitting device) or resulting in decrease of the emission intensity.

The lower limit of the atomic percent of element X may be 0.01%, preferably 0.1%. If the atomic percent of element His lower than 0.01%, there would be no or little effect produced by inclusion of element X in the well layer (effect that the threshold current density decreases and the emission intensity increases as compared with a well layer without element X). On the other hand, the atomic percent of element X that is 0.1% or higher is preferable since a satisfactory effect is achieved by inclusion of element X in the well layer.

<Emission Wavelength of the Device of the Present Invention>

The light-emitting device according to the present invention including a well layer made of GaNX has an emission wavelength which can be adjusted by adjustment of the atomic percent of element X within the GaNX well layer. For example, $GaN_{1-x}As_x$ with x=0.005, $GaN_{1-y}P_y$ with y=0.01, and $GaN_{1-z}Sb_z$ with z=0.002 provide an emission wavelength of approximately 380 nm of ultraviolet radiation. $GaN_{1-x}As_x$ with x=0.02, $GaN_{1-y}P_y$ with y=0.03, and $GaN_{1-z}Sb_z$ with z=0.01 provide an emission wavelength of approximately 410 nm of violet radiation. $GaN_{1-x}As_x$ with x=0.03, $GaN_{1-y}P_y$ with y=0.06, and $GaN_{1-z}Sb_z$ with z=0.02 provide an emission wavelength of approximately 470 nm of blue radiation. $GaN_{1-x}As_x$ with x=0.05, $GaN_{1-y}P_y$ with y=0.08, and $GaN_{1-z}Sb_z$ with z=0.03 provide an emission wavelength of approximately 520 nm of green radiation. Moreover, $GaN_{1-x}As_x$ with x=0.07, $GaN_{1-y}P_y$ with y=0.12, and $GaN_{1-z}Sb_z$ with z=0.04 provide an emission wavelength of approximately 650 nm of red radiation. An emission wavelength as close as possible to a desired wavelength is achieved by forming a GaNX well layer with any of the atomic percents as specified above.

For a light-emitting device according to the present invention including a well layer made of InGaNX, the emission wavelength can be adjusted by adjustment of the atomic percent of element X and that of In that are contained in the InGaNX well layer. Here, the atomic percent of In refers to the one represented by $N_{In}/(N_{In}+N_{Ga})$, where $N_{In}$ represents the number of In atoms and $N_{Ga}$ represents the number of Ga atoms.

Table 1 shows a relation between the emission wavelength and the atomic percent of element X (As) in InGaNX crystal. Table 2 shows a relation between the emission wavelength and the atomic percent of element X (P) in InGaNX crystal. Any emission wavelength as close as possible to a desired wavelength is achieved by producing an InGaNX well layer having the atomic percent of element X in any of those values shown in Table 1 or Table 2.

TABLE 1

| | | InGaNX Atomic Percent of In | | | | | | |
|---|---|---|---|---|---|---|---|---|
| | | 1% | 2% | 5% | 10% | 20% | 35% | 50% |
| Emission Wavelength | 380 nm | 0.5 | 0.4 | 0.1 | | | | |
| | 400 nm | 1.2 | 1.1 | 0.8 | 0.3 | | | |
| | 410 nm | 1.6 | 1.5 | 1.1 | 0.6 | | | |
| | 470 nm | 3.4 | 3.3 | 2.9 | 2.4 | 1.4 | 0.1 | |
| | 520 nm | 4.6 | 4.5 | 4.1 | 3.6 | 2.5 | 1.2 | 0.1 |
| | 650 nm | 7 | 6.9 | 6.5 | 5.9 | 4.8 | 3.4 | 2.3 |

For providing each emission wavelength atomic percent (%) of element X in InGaNX, where element X is As

TABLE 2

| | | InGaNX Atomic Percent of In | | | | | | |
|---|---|---|---|---|---|---|---|---|
| | | 1% | 2% | 5% | 10% | 20% | 35% | 50% |
| Emission Wavelength | 380 nm | 0.8 | 0.6 | 0.1 | | | | |
| | 400 nm | 2 | 1.8 | 1.3 | 0.4 | | | |
| | 410 nm | 2.5 | 2.3 | 1.8 | 1 | | | |
| | 470 nm | 5.5 | 5.3 | 4.7 | 3.8 | 2.2 | 0.1 | |
| | 520 nm | 7.5 | 7.3 | 6.7 | 5.8 | 4.1 | 1.9 | 0.1 |
| | 650 nm | 11.6 | 11.4 | 10.7 | 9.7 | 7.9 | 5.5 | 3.6 |

For providing each emission wavelength atomic percent (%) of element X in InGaNX, where element X is P <Impurity Added to the Well Layer of the Device of the Present Invention>

To the well layer of the light-emitting device according to the present invention, at least one impurity element selected from the group consisting of Si, O, S, C, Ge, Zn, Cd and Mg can be added in an amount ranging from $1\times10^{17}/cm^3$ to $1\times10^{19}/cm^3$ for the purpose of enhancing the emission intensity of the device and decreasing the threshold current density of the device. For example, addition of Si to the well layer of the light-emitting device of the present invention renders the emission intensity almost 1.1 to 1.3 times higher than the emission intensity of the device without Si. In particular, such a effect achieved by addition of impurity is remarkable when the substrate is not of the nitride semiconductor but of another material, for example, a sapphire substrate (hereinafter referred to as hetero-substrate), on which the device structure of the present invention is grown. The nitride semiconductor light-emitting device fabricated on the hetero-substrate has a high crystal defect density (e.g., crystal defect density evaluated by the etch pit density corresponds to at least $4\times10^8/cm^2$). Then, one possible reason for the above-described remarkable effect is that, addition of the impurity to the well layer improves the crystallinity of the well layer. This effect, i.e., enhancement of the emission intensity, is difficult to achieve by addition of any impurity in an amount smaller than $1\times10^{17}/cm^3$. On the other hand, addition of impurity in an amount larger than $1\times10^{19}/cm^3$ could increase the crystal defect density (decrease the emission intensity).

<Thickness of the Barrier Layer of the Device of the Present Invention>

When the light-emitting device according to the present invention has a light-emitting layer constituted of well and barrier layers, the barrier layer preferably has a thickness ranging from 3 nm to 20 nm. More preferably, the thickness of the barrier layer is equal to or larger than that of the well layer. If the thickness of the barrier layer is smaller than 3 nm or greater than 20 nm, it would be unlikely that the threshold current density is further decreased or the emission intensity is further enhanced. On the other hand, if the thickness of the barrier layer is equal to or greater than that of the well layer, it is possible to prevent the crystal system separation which occurs to a slight degree within one well layer from propagating to another well layer, the barrier layer being interposed between these well layers, and accordingly prevent advancement of the crystal system separation. In order to more effectively avoid propagation of the crystal system separation, the barrier layer has its thickness at least 1.5 times as large as that of the well layer.

In particular, the effect achieved by the above-discussed appropriate thickness range of the barrier layer is remarkable when the barrier layer is formed of GaN. When the barrier layer is constituted of GaN, an appropriate crystal growth temperature of the well layer is different from that of the GaN barrier layer, resulting in deterioration of the crystallinity of the GaN barrier layer. Then, the crystal system separation caused to a slight degree within one well layer is likely to be propagated to another well layer between which the GaN barrier layer is interposed. Accordingly, by the appropriate thickness range of the GaN barrier layer, such a propagation of the crystal system separation can effectively be avoided.

For the light-emitting device according to the present invention, a multiple quantum well structure can be formed that is constituted of well layers containing element X and GaN barrier layers. The thickness of the GaN barrier layer preferably ranges from 3.2 nm to 17 nm.

<Number of Well Layers of the Device of the Present Invention>

According to the present invention, a nitride semiconductor laser device is formed that has a multiple quantum well structure including $GaN_{0.97}P_{0.03}$ well layers (each thickness 4.2 nm)/GaN barrier layers (each thickness 8 nm). In this case, as discussed below, there is a relation between the number of well layers and the lasing threshold current density and the lasing threshold current density depends on the substrate on which the nitride semiconductor laser device is formed.

Specifically, the threshold current density of the nitride semiconductor laser device decreases, regardless of the substrate, when the number of well layers is 8 or less. The number of well layers ranging from 2 to 6 is preferable since the threshold current density is low for that range of the well-layer number. For any number of well layers, the threshold current density is lower when the nitride semiconductor laser device is grown on a nitride semiconductor substrate (e.g. GaN substrate) than that when the nitride semiconductor laser device is grown on a hetero-substrate. It is noted that the relation between the number of well layers and the threshold current density that is established when the substrate is a nitride semiconductor substrate is similar to that when the substrate is a pseudo GaN substrate.

The above-discussed effect is achieved by using a multiple quantum well structure, instead of the multiple quantum well structure including $GaN_{0.97}P_{0.03}$ well layers (thickness 4.2 nm)/GaN barrier layers (thickness 8 nm), with the atomic percent of element X (P) except for 0.03, or well layers containing element X other than P, or different thickness(es) of the layers, on the condition that the light-emitting layer satisfies requirements of the present invention. The light-emitting layer exhibiting the same effect includes, for example, a light-emitting layer including GaNAs well layers/GaN barrier layers, a light-emitting layer including GaNAsP well layers/GaN barrier layers, a light-emitting layer including InGaNAs well layers/GaN barrier layers, a light-emitting layer including InGaNP well layers/GaN barrier layers, and a light-emitting layer including InGaNAsP well layers/GaN barrier layers.

Moreover, when a nitride semiconductor light-emitting diode device having a multiple quantum well structure including $GaN_{0.94}P_{0.06}$ well layers (thickness 3.2 nm)/GaN barrier layers (thickness 6 nm) is produced according to the present invention, there is a relation between the number of well layers and the emission intensity as well as dependence on the substrate on which the nitride semiconductor light-emitting diode device is formed, as described below.

The emission intensity of the nitride semiconductor light-emitting diode device is higher, regardless of the substrate, when the number of well layers ranges from 2 to 8, relative to that of a single quantum well structure. In particular, the number of well layers ranging from 3 to 5 increases the emission intensity and thus preferable. Moreover, for any number of well layers, the emission intensity is higher when the nitride semiconductor light-emitting diode device is grown on a nitride semiconductor substrate (e.g. GaN substrate) than that when the nitride semiconductor light-emitting diode device is grown on a hetero-substrate. It is noted that the relation between the number of well layers and the emission intensity that is established when the substrate is a nitride semiconductor substrate is similar to that when the substrate is a pseudo GaN substrate.

The above-discussed effect is achieved by using a multiple quantum well structure, instead of the multiple quantum well structure including $GaN_{0.94}P_{0.06}$ well layers (thickness 3.2 nm)/GaN barrier layers (thickness 6 nm), with the atomic percent of element X (P) except for 0.06, or well layers containing element X other than P, or different thickness(es) of the layers, on the condition that the light-emitting layer satisfies requirements of the present invention. The light-emitting layer exhibiting the same effect includes, for example, a light-emitting layer including GaNAs well layers/GaN barrier layers, a light-emitting layer including GaNAsP well layers/GaN barrier layers, a light-emitting layer including InGaNAs well layers/GaN barrier layers, a light-emitting layer including InGaNP well layers/GaN barrier layers, and a light-emitting layer including InGaNAsP well layers/GaN barrier layers. The effect as described above is also achieved for super luminescent diode device.

<Substrate on Which the Nitride Semiconductor Light-Emitting Device of the Present Invention is Grown>

The inventors of the present invention have found that the crystal system separation of element X that appears in the well layer of the device of the present invention varies depending on the substrate on which the well layer is grown. According to the inventors, segregation of element X included in the well layer is likely to occur near a crystal defect generated in the semiconductor crystal. This means that the crystal system separation of element X is likely to occur near a crystal defect. Then, an appropriate substrate could be selected to decrease the crystal defect density within the semiconductor crystal and accordingly reduce the degree of crystal system separation of element X that occurs within the well layer. The crystal system separation to a slight degree does not significantly deteriorate characteristics of the light-emitting device. However, as the crystal system separation advances or increases in its degree, the characteristics of the light-emitting device further deteriorate. Therefore, it is important to avoid or reduce the crystal system separation.

According to the inventors of the present invention, a most preferred substrate to be used for the nitride semiconductor light-emitting device of the present invention is a GaN substrate (one example of the nitride semiconductor substrate). The nitride semiconductor crystal grown on the GaN substrate has a defect density of $5 \times 10^7/cm^2$ or lower that is measured by means of the etch pit density. This defect density is lower than the etch pit density (at least $4 \times 10^8/cm^2$) when a sapphire substrate or an SiC substrate (examples of the hetero-substrate) are used, that have conventionally been employed as a substrate for a nitride semiconductor light-emitting device. Here, the etch pit density is determined by soaking an epi-wafer (light-emitting device) in an etching liquid (250° C.) of phosphoric acid:sulfuric acid=1:3 for 10 minutes and measuring the density of pits formed on the surface of that wafer. This etch pit density is determined by measuring the density of pits on the epi-wafer surface. Therefore, the density of crystal defects in the light-emitting layer is not actually measured. However, when the etch pit density is high, the crystal defect density in the light-emitting layer is also high. Then, the etch pit density can be used for evaluating whether the density of crystal defects within the light-emitting layer is high or not.

A second-preferable substrate is a pseudo GaN substrate (an example of the pseudo nitride substrate). The pseudo GaN substrate is produced by a method detailed herein later. A nitride semiconductor layer grown on the pseudo GaN substrate has an etch pit density of $7 \times 10^7/cm^2$ or lower in a region of the lowest etch pit density. This density is close to the density in the nitride semiconductor layer grown on a GaN substrate. However, in the pseudo GaN substrate, there are both of a region of a high etch pit density and a region of a low etch pit density, so that the yield of the light-emitting devices on pseudo GaN substrates is inferior to that of light-emitting devices grown on GaN substrates. However, the pseudo GaN substrate is advantageous in that large-area devices can easily be produced at a lower cost, as compared with the GaN substrate.

<Embodiments of the Nitride Semiconductor Laser of the Present Invention>

Embodiment 1

Figure 1:
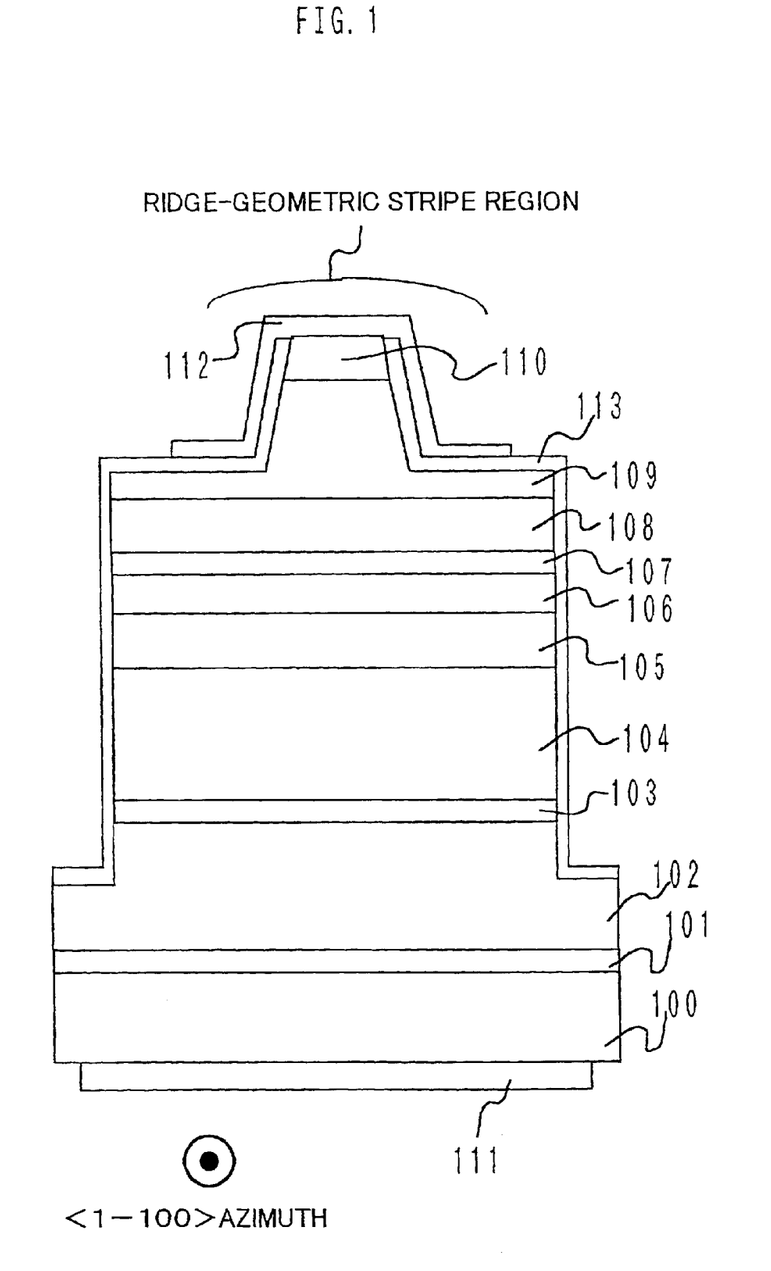
FIG. 1 schematically shows a cross section of a laser device structure in Embodiment 1.

FIG. 1 shows an embodiment of a nitride semiconductor laser device according to the present invention. The device shown in FIG. 1 includes a C-plane (0001) n-type GaN substrate 100, a low-temperature GaN buffer layer 101, an n-type GaN layer 102, an n-type $In_{0.07}Ga_{0.93}N$ anti-crack layer 103, an n-type $Al_{0.1}Ga_{0.9}N$ cladding layer 104, an n-type GaN optical guide layer 105, a light-emitting layer 106, a p-type $Al_{0.2}Ga_{0.8}N$ carrier blocking layer 107, a p-type GaN optical guide layer 108, a p-type $Al_{0.1}Ga_{0.9}N$ cladding layer 109, a p-type GaN contact layer 110, an n-type electrode 111, a p-type electrode 112, and an $SiO_2$ dielectric layer 113. Light-emitting layer 106 formed between the n-type nitride semiconductor layer and the p-type nitride semiconductor layer has a structure as described below that includes $GaN_{0.97}P_{0.03}$ well layers each thickness 4 nm and GaN barrier layers each thickness 10 nm that are stacked on each other in three cycles.

The device shown in FIG. 1 is produced through a process as described below. In an MOCVD (metal organic chemical vapor deposition) apparatus, n-type GaN substrate 100 is placed. A group V material, $NH_3$ (ammonia) and a group III material, TMGa (trimethyl gallium) or TEGa (triethyl gallium) are used to grow low temperature GaN buffer layer 101 at a growth temperature of 550° C. to a thickness of 100 nm. Then, at a growth temperature of 1050° C., $SiH_4$ (silane) is added to the above-described materials to form n-type GaN layer 102 (Si impurity concentration: $1 \times 10^{18}/cm^3$) to a thickness of 3 μm. The growth temperature is lowered to approximately 700° C.–800° C., one of group III materials, TMIn (trimethyl indium) is supplied to grow n-type $In_{0.07}Ga_{0.93}N$ anti-crack layer 103 to a thickness of 40 nm. The substrate temperature is raised back to 1050° C., and a group III material, TMAl (trimethyl aluminum) or TEAl (triethyl aluminum) is used to grow n-type $Al_{0.1}Ga_{0.9}N$ cladding layer 104 (Si impurity concentration: $1 \times 10^{18}/cm^3$) to a thickness of 1.2 μm. Then, n-type GaN optical guide layer 105 (Si impurity concentration: $1 \times 10^{18}/cm^3$) is grown to a thickness of 0.1 μm. After this, the substrate temperature is lowered to 800° C., $PH_3$ or TBP (t-butyl phosphine) is added as a P material. Light-emitting layer (multiple quantum well structure) 106 is thus grown that is constituted of 4 nm-thick $GaN_{0.97}P_{0.03}$ well layers and 10 nm-thick GaN barrier layers stacked in three cycles. The order of these layers is: barrier layer/well layer/barrier layer/well layer/barrier layer/well layer/barrier layer. At this time, $SiH_4$ (Si impurity concentration: $1 \times 10^{18}/cm^3$) is added to both of the barrier and well layers. The growth may be interrupted for 1 to 180 seconds between growth of a barrier layer and growth of a well layer or between growth of a well layer and growth of a barrier layer. In this way, each layer has an enhanced planarity which decreases the emission half-width.

If any As compound is added to well layers, $AsH_3$ or TBAs (t-butyl arsine) is preferred. If any Sb compound is added to well layers, TMSb (trimethyl antimony) or TESb (triethyl antimony) is preferred. Instead of $NH_3$ used as an N material for forming the well layers, dimethyl hydrazine may be used.

The substrate temperature is raised again to 1050° C., and p-type $Al_{0.2}Ga_{0.8}N$ carrier blocking layer 107 of thickness 20 nm, p-type GaN optical guide layer 108 of 0.1 μm in thickness, p-type $Al_{0.1}Ga_{0.9}N$ cladding layer 109 of 0.5 μm in thickness, and p-type GaN contact layer 110 of 0.1 μm in thickness are grown. As a p-type impurity element, Mg ($EtCP_2Mg$: bis-ethylcyclopentadienyl magnesium) is added in $5 \times 10^{19}/cm^3 - 2 \times 10^{20}/cm^3$. The p-type impurity concentration in p-type GaN contact layer 110 preferably increases toward the location where p-type electrode 112 is formed, so that the contact resistance upon formation of the p-type electrode decreases. Moreover, in order to remove hydrogen remaining in the p-type layer that hinders activation of p-type impurity Mg, a slight amount of oxygen may be added into the p-type layer being grown.

Accordingly, after p-type GaN contact layer 110 is grown, the atmosphere within the reactor of the MOCVD apparatus is fully replaced with nitrogen carrier gas and $NH_3$ and the temperature is lowered at a rate of 60° C./min. When the substrate temperature is lowered to reach 800° C., supply of $NH_3$ is stopped, this substrate temperature is maintained for 5 minutes, and the temperature is lowered to room temperature. Preferably, the substrate temperature of preferably 650°

C.–900° C. is maintained for 3–10 minutes. The rate of decreasing the substrate temperature is at least 30° C./min. The layer thus grown is analyzed by means of Raman effect. Then, it is found that the layer thus grown exhibits a p-type feature (Mg is activated) without annealing performed thereon which is generally used for conventional nitride semiconductor in order to render the p-type feature to the layer. In addition, decrease is found in the contact resistance occurring due to formation of the p-type electrode. When the conventional annealing for giving p-type feature is incorporated, the ratio of activated Mg atoms increases, which is thus preferable.

Then, the epi-wafer produced through the crystal growth process described above is removed from the MOCVD apparatus, and a laser device is produced through the process described below.

On the rear side of n-type GaN substrate 100, n-type electrode 111 is formed in the order of Hf/Al. Instead of this n-type electrode material, Ti/Al, Ti/Mo or Hf/Af for example may be used. Hf is preferable for the n-type electrode since Hf decreases the contact resistance of the n-type electrode.

The portion corresponding to the p-type electrode is etched into the shape of stripe along orientation <1–100> of the nitride semiconductor crystal to form the ridge stripe portion as shown in FIG. 1. The ridge stripe portion is formed to have the stripe width of 2 μm. Then, $SiO_2$ dielectric layer 113 is vapor-deposited, p-type GaN contact layer 110 is exposed, and vapor deposition in the order of Pd/Mo/Au produces p-type electrode 112. Instead of this p-type electrode material, Pd/Pt/Au, Pd/Au or Ni/Au may be used.

Finally, cleavage planes of the GaN substrate are used to fabricate a Fabry-Perot resonator with the resonator length of 500 μm. Preferably, the resonator length is generally 300 μm–1000 μm. M-planes ({1–100} planes) of the GaN substrate are used as mirror planes of the resonator. Instead of the feedback method of the laser resonator, generally known DFB (Distributed Feedback) or DBR (Distributed Bragg Reflector) may be used. After the mirror planes of the Fabry-Perot resonator are formed, dielectric layers respectively of $SiO_2$ and $TiO_2$ with a reflectivity of 70% are vapor-deposited on each other to produce a dielectric multi-layer reflective film. Instead of this dielectric material, $SiO_2/Al_2O_3$ may be used as the dielectric multi-layer reflective film.

In this way, the nitride semiconductor laser device is produced.

The device discussed above may be modified as described below.

Low-temperature GaN buffer layer 101 may be the one represented by $Al_xGa_{1-x}N$ ($0 \leq x \leq 1$). Alternatively, the low temperature buffer layer itself may be dispensed with. However, if the surface morphology of the GaN substrate is not a desired one, the surface morphology is improved by inserting the low temperature $Al_xGa_{1-x}N$ ($0 \leq x \leq 1$) buffer layer. Here, the low temperature buffer layer refers to a buffer layer formed at a growth temperature ranging from approximately 450° C. to 600° C. The buffer layer thus grown in this temperature range is polycrystalline or amorphous.

$In_{0.07}Ga_{0.93}N$ anti-crack layer 103 may have any In ratio except for 0.07. Alternatively, the InGaN anti-crack layer itself may be dispensed with. However, if there is a great lattice mismatch between the cladding layer and the GaN substrate, the InGaN anti-crack layer is advantageously used.

Figure 7A:
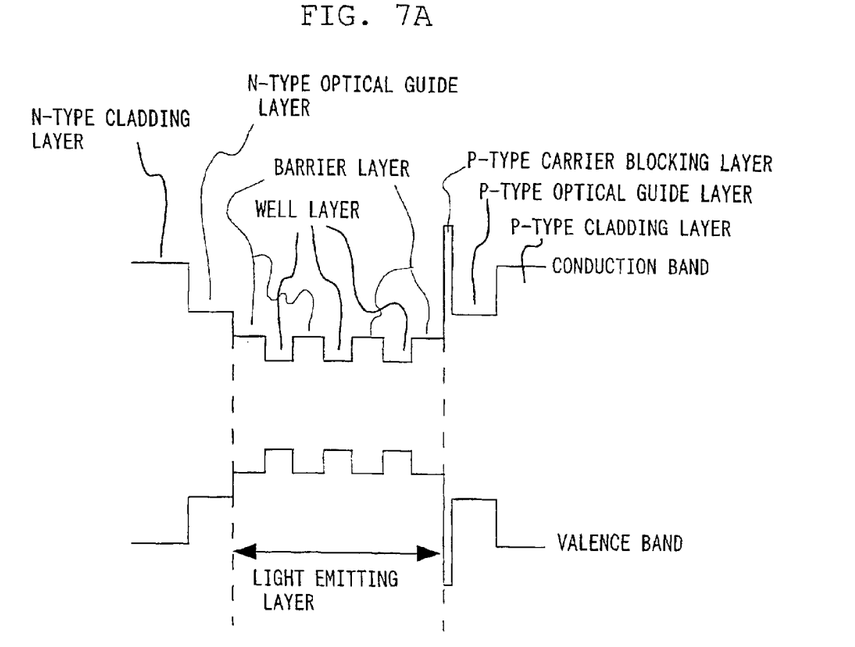
FIG. 7A schematically shows a bandgap structure of a nitride semiconductor light-emitting device including a light-emitting layer with respective barrier layers on both ends, and FIG. 7B schematically shows a bandgap structure of a nitride semiconductor light-emitting device including a light-emitting layer with respective well layers on both ends.
Figure 7B:
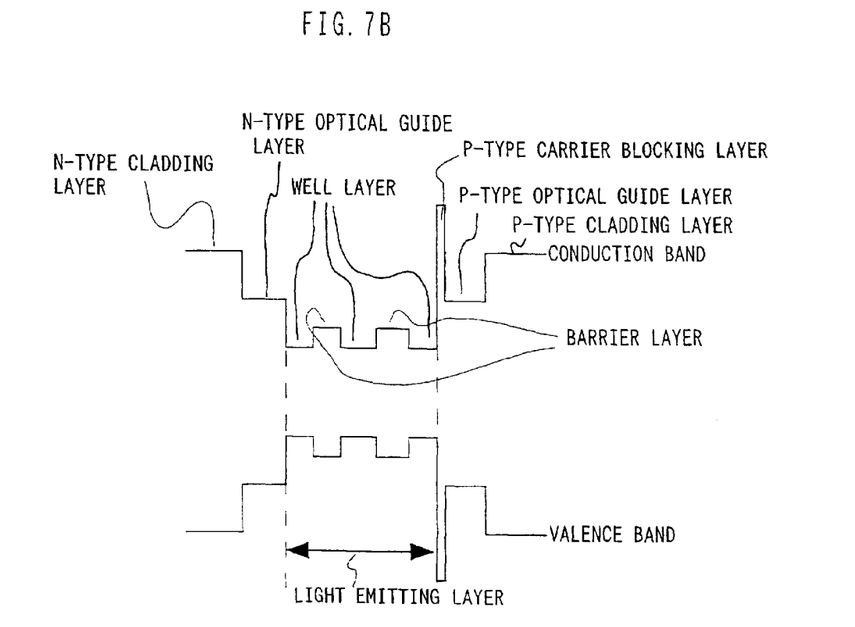

The above-discussed light-emitting layer is structured to have its ends where barrier layers are formed respectively (FIG. 7A). Instead, well layers may be formed respectively on both ends of the structure of the light-emitting layer (FIG. 7B). In addition, the number of light-emitting layer (the number of well layers) is not limited to 3. When the number of the light-emitting layers is 8 or less, the threshold current density is low. In particular, the number of well layers ranging from 2 to 6 is preferably used to achieve a low threshold current density.

Addition of impurity to the well layers provides a higher emission intensity and a lower threshold current density. However, instead of adding Si to both of well and barrier layers in a concentration of $1 \times 10^{18}/cm^3$, the impurity may be added to the barrier layers only or no impurity may be added to well and barrier layers. When the device uses a nitride semiconductor substrate, the nitride semiconductor crystal has a lower crystal defect density than the crystal defect density which is observed when a hetero-substrate is employed. Then, addition of impurity could increase optical absorption (gain loss) in the well layers, without improving crystallinity of the well layers. Therefore, when the nitride semiconductor substrate is used, the amount of impurity to be added to the well layers preferably ranges from 0 or $1 \times 10^{16}$ to $5 \times 10^{18}/cm^3$.

In p-type $Al_{0.2}Ga_{0.8}N$ carrier blocking layer 107 of the above-discussed device, the composition ratio of Al may be any except for 0.2. Alternatively, the carrier blocking layer itself may be dispensed with. However, the threshold current density is low when the carrier blocking layer is provided, since the carrier blocking layer serves to confine carriers within the light-emitting layer. A higher ratio of Al in the composition of the carrier blocking layer is preferable since the higher Al ratio enhances the degree to which the carriers are confined. On the other hand, the ratio of Al in the composition may preferably be lowered to the extent that carriers are satisfactorily confined, since such an appropriately lowered Al ratio increases the mobility of carriers within the carrier blocking layer which lowers electrical resistance.

For the p-type cladding layer and n-type cladding layer, instead of the $Al_{0.1}Ga_{0.9}N$ crystal, a ternary crystal AlGaN having an Al composition ratio except for 0.1 may be used. A higher composition ratio of Al increases the energy gap difference and the refractive index difference relative to the light-emitting layer, carriers and light are thus confined efficiently within the light-emitting layer, and consequently the lasing threshold current density decreases. On the other hand, the ratio of Al in the composition may preferably be lowered to the extent that carriers are satisfactorily confined, since such an appropriately lowered Al ratio increases the mobility of carriers within the cladding layer which decreases the operating voltage of the device.

Preferably, the AlGaN cladding layer ranges from 0.7 μm to 1.5 μm in thickness. This range of thickness allows the vertical transverse mode to have unimodal distribution and allows the light-confinement efficiency to be enhanced. Consequently, the laser has improved optical characteristics and the lasing threshold current density decreases.

The cladding layer is not limited to the ternary crystal AlGaN. Instead of the ternary crystal AlGaN, any quaternary crystal, for example, AlInGaN, AlGaNP or AlGaNAs may be used. Further, the p-type cladding layer may have a superstructure formed of a p-type AlGaN layer and a p-type GaN layer or a superstructure formed of a p-type AlGaN layer and a p-type InGaN layer.

For the device as discussed above, instead of the C-plane {0001} of the GaN substrate, the substrate may have another orientation of the main plane, for example, A-plane {11–20}, R-plane {1–102}, M-plane {1–100} or {1–101} plane. A satisfactory surface morphology is obtained if the substrate has an off-orientation within 2 degrees with respect to the above-described orientations.

For the device as discussed above, a nitride semiconductor substrate except for the GaN substrate may be used. In order to allow the vertical transverse mode to have unimodal distribution, the nitride semiconductor laser preferably has a layer, which has a lower refractive index than that of the cladding layer, contacting the outside of the cladding layer, and an AlGaN substrate is appropriately used.

For the process as discussed above, instead of the crystal growth method by means of the MOCVD apparatus, molecular beam epitaxy (MBE) and hydride vapor phase epitaxy (HVPE) may be used.

Figure 4:
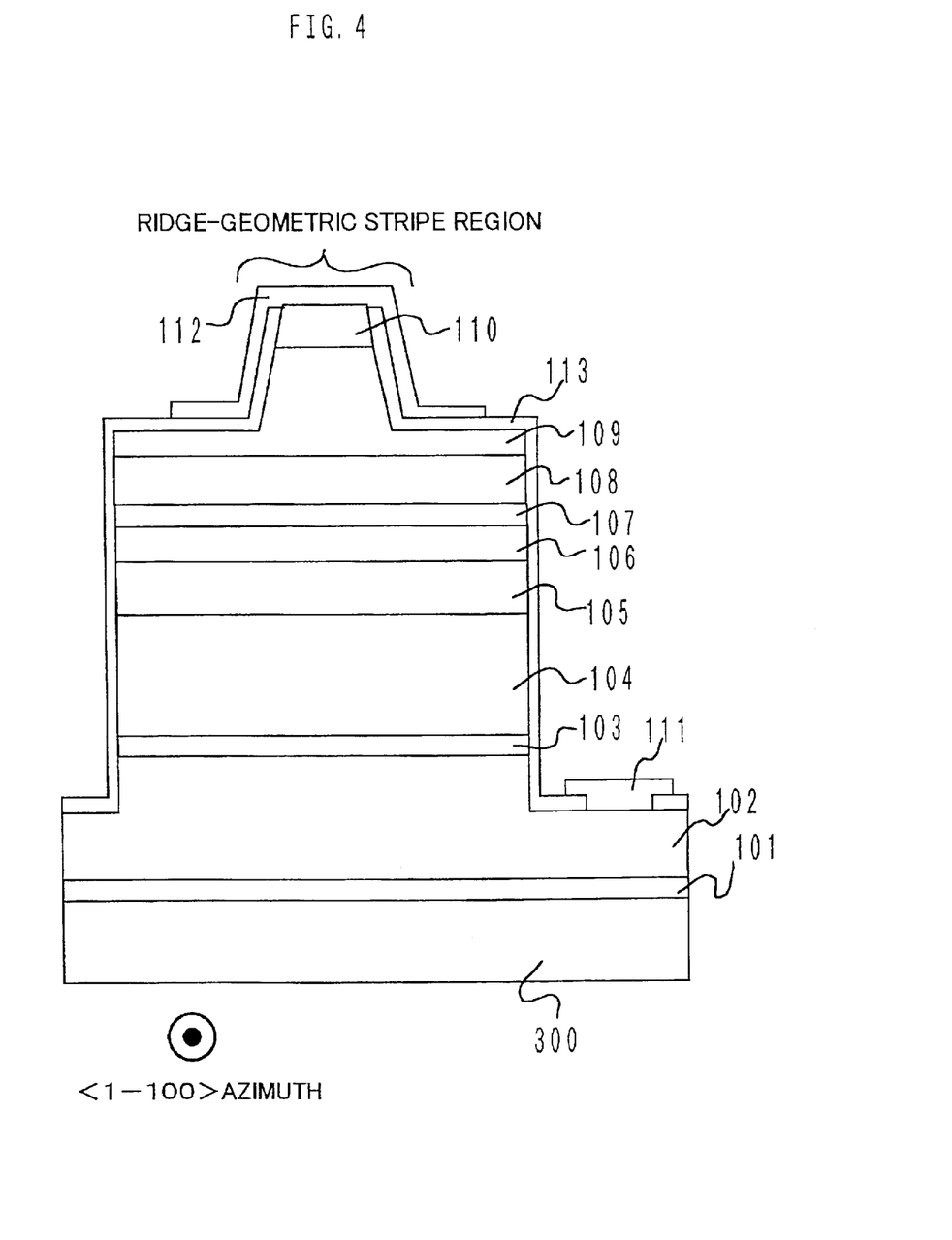
FIG. 4 schematically shows a cross section of a laser device structure in Embodiments 2 and 3.

Although n-type electrode 111 is formed on the rear side of n-type GaN substrate 100, the n-type electrode may be formed by exposing n-type GaN layer 102 through dry etching performed on the front side of the epi-wafer (see FIG. 4).

Embodiment 2

Figure 3B:
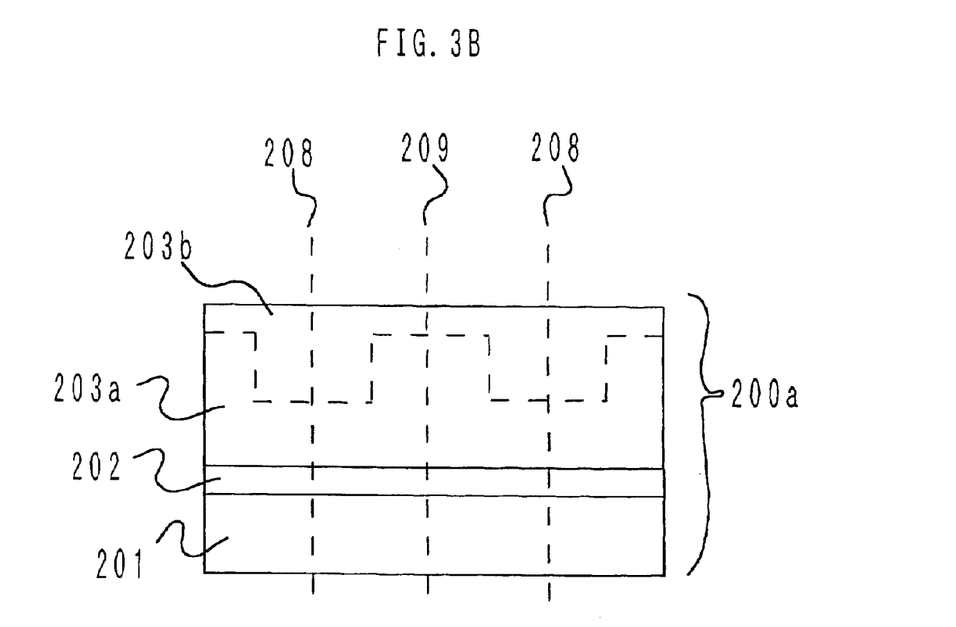

In the device shown in FIG. 1, GaN substrate 100 is replaced with a pseudo GaN substrate 200 shown in FIG. 2 or a pseudo GaN substrate 200a shown in FIG. 3B, and an n-type electrode is formed on one side of the device as shown in FIG. 4. A nitride semiconductor laser device is accordingly fabricated similarly to Embodiment 1 except for above details.

Pseudo GaN substrate 200 shown in FIG. 2 is constituted of a seed substrate 201, and a low temperature buffer layer 202, an n-type GaN layer 203, an anti-growth layer 204 and an n-type GaN thick layer 205 that are formed on seed substrate 201. Seed substrate 201 is used as a parent material on which n-type GaN thick layer 205 is grown. Anti-growth layer 204 is used for preventing the nitride semiconductor crystal layer from growing directly on the underlayer. Crystal growth through anti-growth layer 204 allows the growth to selectively be done in a specific crystal orientation. Any pseudo GaN substrate except for the one shown in FIG. 2 may be employed on the condition that the substrate has at least a seed layer, an anti-growth layer and a GaN layer.

Pseudo GaN substrate 200a shown in FIG. 3B is constituted of a seed substrate 201, and a low temperature buffer layer 202, a first n-type GaN layer 203a and a second n-type GaN layer 203b that are formed on seed substrate 201. FIG. 3A shows a part of the entire process for producing pseudo GaN substrate 200a, and FIG. 3B shows pseudo GaN substrate 200a which is completed. Pseudo GaN substrate 200a is formed as shown in FIG. 3A by forming, on seed substrate 201, low temperature buffer layer 202 and the first n-type GaN layer 203a, and then processing the surface of GaN layer 203a through dry etching or wet etching so that grooves are formed in the surface of GaN layer 203a. After this, the substrate is again transported to the crystal growth apparatus for depositing the second GaN layer 203b, and thus pseudo GaN substrate 200a is completed (FIG. 3B). Referring to FIG. 3A, although the grooves are formed not to reach the bottom of the first n-type GaN layer 203a, the grooves may reach low temperature buffer layer 202 or seed substrate 201.

On this pseudo GaN substrate 200 or pseudo GaN substrate 200a thus produced, a nitride semiconductor crystal is grown. Then, the nitride semiconductor crystal has an etch pit density ($7 \times 10^7$/cm$^2$ or less) which is lower than an etch pit density (at least $4 \times 10^8$/cm$^2$) of the nitride semiconductor crystal grown on a hetero-substrate. However, the pseudo GaN substrate has a region of a low etch pit density (corresponding to a region where the crystal defect density is low) and a region of a higher etch pit density. Referring to pseudo GaN substrate 200 shown in FIG. 2, the etch pit density is relatively high on a part 206 directly above the middle of the width of the anti-growth layer and a part 207 directly above the middle of the width of a region where no anti-growth layer is formed, and the etch pit density is relatively low in any region except for the above parts. Further, referring to the pseudo GaN substrate shown in FIG. 3B, the etch pit density is relatively high at a part 208 directly above the middle of the width of the groove and at a part 209 directly above the middle of the width of a region (protrusion) where no groove is formed, and the etch pit density is relatively low in any region except for the above parts. In other words, at the midpoint between the parts 206 and 207 in FIG. 2 and the midpoint between the parts 208 and 209 in FIG. 3B, the etch pit density is relatively low and, the etch pit density is relatively high at the parts 206, 207, 208 and 209 (crystal defect density is high). Then, a nitride semiconductor device to be formed on a pseudo GaN substrate may be fabricated in such regions as described above where the etch pit density is low. For example, when a semiconductor laser is to be fabricated, a ridge stripe portion or a portion narrowing the electric current of the laser is formed not to include the regions 206, 207, 208 and 209.

Examples of seed substrate 201 are C-plane sapphire, M-plane sapphire, A-plane sapphire, R-plane sapphire, GaAs, ZnO, MgO, spinel, Ge, Si, GaN, 6H—SiC, 4H—SiC and 3C—SiC for example. Examples of anti-growth layer 204 are such dielectric layers as $SiO_2$ layer, $SiN_x$ layer, $TiO_2$ layer and $Al_2O_3$ layer, and such a metal layer as tungsten layer.

If the seed substrate is formed of an electrically insulating material like sapphire, the n-type electrode is formed as shown in FIG. 4 on one side. On the other hand, if the seed substrate is a conductive substrate like an SiC substrate and Si substrate, the n-type electrode may be formed as shown in FIG. 1 on the rear side of the substrate. In this case, a high temperature buffer layer should be used instead of low temperature buffer layer 202. Here, the high temperature buffer layer refers to a buffer layer formed at a growth temperature of at least 700° C. In addition, the high temperature buffer layer should contain at least Al since a nitride semiconductor layer with a good crystallinity is never fabricated on the SiC substrate or Si substrate when the high temperature buffer layer does not contain at least Al. The high temperature buffer layer most preferably has a structure of InAlN.

The seed substrate (of hexagonal system) has its main plane with an orientation of C-plane {0001}, A-plane {11–20}, R-plane {1–102}, M-plane {1–100} or {1–101} plane. A satisfactory surface morphology is achieved if the substrate has its main plane orientation within 2 degrees with respect to the above-described orientations.

The pseudo GaN substrate as discussed above is used to form the nitride semiconductor light-emitting device (semiconductor laser device) as shown in FIG. 4. The device shown in FIG. 4 includes a substrate 300, a low-temperature GaN buffer layer 101, an n-type GaN layer 102, an n-type $In_{0.07}Ga_{0.93}N$ anti-crack layer 103, an n-type $Al_{0.1}Ga_{0.9}N$ cladding layer 104, an n-type GaN optical guide layer 105, a light-emitting layer 106, a p-type $Al_{0.2}Ga_{0.8}N$ carrier blocking layer 107, a p-type GaN optical guide layer 108, a p-type $Al_{0.1}Ga_{0.9}N$ cladding layer 109, a p-type GaN contact layer 110, an n-type electrode 111, a p-type electrode 112, and an $SiO_2$ dielectric layer 113. Here, substrate 300 is the pseudo GaN substrate as described above. The layers and electrodes of this device are formed on the substrate in a similar manner to that of Embodiment 1.

The nitride semiconductor laser device as shown in FIG. 4 includes a ridge stripe portion which is formed not to include at least the parts 206 and 207 shown in FIG. 2 and the parts 208 and 209 shown in FIG. 3B.

Low-temperature GaN buffer layer 101 may be the one represented by $Al_xGa_{1-x}N$ ($0 \leq x \leq 1$). Alternatively, the low temperature buffer layer itself may be dispensed with. However, if the surface morphology of the pseudo GaN substrate is not a desired one, the surface morphology is improved by inserting the low temperature $Al_xGa_{1-x}N$ ($0 \leq x \leq 1$) buffer layer.

Substrate 300 may be the pseudo GaN substrate from which seed substrate 201 is removed off by a grinding machine. Alternatively, substrate 300 may be the pseudo GaN substrate from which low temperature buffer layer 201 and subsequent layers are all removed by a grinding machine. Further, alternatively, substrate 300 may be the pseudo GaN substrate from which anti-growth layer 204 and subsequent layers are all removed by a grinding machine. If seed substrate 201 is removed from pseudo GaN substrate, n-type electrode 111 may be formed on the side where the removed seed substrate is originally formed. In addition, seed substrate 201 may be removed after the nitride semiconductor light-emitting device is produced.

Embodiment 3

According to this embodiment, a nitride semiconductor laser device is produced in a similar manner to that of Embodiment 1 except that the nitride semiconductor laser device is formed on a hetero-substrate with a nitride semiconductor buffer layer therebetween and that an n-type electrode is formed on one side as shown in FIG. 4. The nitride semiconductor laser device thus produced has the structure as shown in FIG. 4 and includes a substrate 300, a low temperature GaN buffer layer 101 (thickness 25 nm), and n-type GaN layer 102, an n-type $In_{0.07}Ga_{0.93}N$ anti-crack layer 103, an n-type $Al_{0.1}Ga_{0.9}N$ cladding layer 104, an n-type GaN optical guide layer 105, a light-emitting layer 106, a p-type $Al_{0.2}Ga_{0.8}N$ carrier blocking layer 107, a p-type GaN optical guide layer 108, a p-type $Al_{0.1}Ga_{0.9}N$ cladding layer 109, a p-type GaN contact layer 110, an n-type electrode 111, a p-type electrode 112, and an $SiO_2$ dielectric layer 113. Here, substrate 300 is a C-plane (0001) sapphire substrate. This device includes layers and electrodes that are formed by the crystal growth method and the process that are similar to those of Embodiment 1.

Instead of the sapphire substrate, substrate 300 may be of 6H—SiC, 4H—SiC, 3C—SiC, Si or spinel ($MgAl_2O_4$) for example. If the SiC substrate or Si substrate which is conductive substrate is used, the n-type electrode may be formed on the rear side of the substrate as shown in FIG. 1. In addition, the buffer layer for growing a nitride semiconductor crystal of a good crystallinity on the SiC or Si substrate is a high temperature buffer layer as described above.

The substrate has its main plane with an orientation of A-plane {11–20}, R-plane {1–102}, M-plane {1–100} or {1–101} plane instead of C-plane {0001}. A satisfactory surface morphology is achieved if the substrate has its main plane orientation within 2 degrees with respect to the above-described orientations.

Embodiment 4

A nitride light-emitting diode device is provided according to this embodiment. The light-emitting diode device shown in FIG. 5 includes an n-type GaN substrate 600 having C-plane (0001), a low temperature GaN buffer layer 601 (thickness 100 nm), an n-type GaN layer 602 (thickness 3 $\mu$m, Si impurity concentration $1 \times 10^{18}/cm^3$), a light-emitting layer 603 (5 cycles of $GaN_{0.97}As_{0.03}$ well layer (thickness 3.1 nm)/GaN barrier layer (thickness 6 nm)), a p-type $Al_{0.1}Ga_{0.9}N$ carrier blocking layer 604 (thickness 20 nm, Mg impurity concentration $6 \times 10^{19}/cm^3$), a p-type GaN contact layer 605 (thickness 0.1 $\mu$m, Mg impurity concentration $1 \times 10^{20}/cm^3$), a light-transmissive electrode 606, a p-type electrode 607, and an n-type electrode 608.

Figure 5:
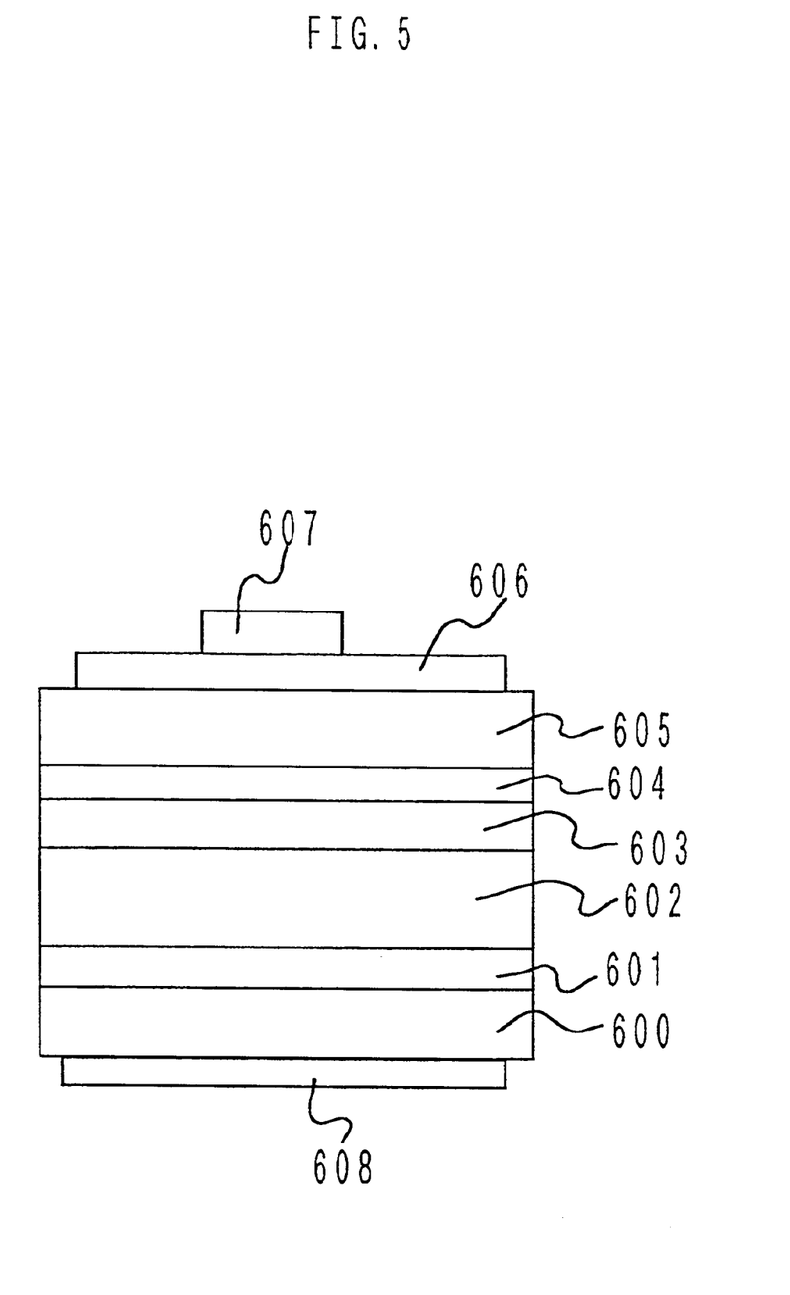
FIG. 5 schematically shows a cross section of a light-emitting diode device in Embodiment 4.

According to this embodiment, n-type electrode 608 is formed on the rear side of n-type GaN substrate 600 in the order of Hf/Al. Instead of this material for the n-type electrode, Ti/Al, To/Mo or Hf/Au for example may be used. In particular, Hf is preferred as a material for the n-type electrode since Hf lowers the contact resistance of the n-type electrode. The n-type electrode may not be formed on the rear side of n-type GaN substrate 600. Instead, the n-type electrode may be formed, as shown in FIG. 4, by exposing one side of n-type GaN layer 602, the side facing toward the p-type electrode, through dry etching by which the p-type electrode of the epi-wafer is etched, so that the n-type electrode is formed on the exposed surface. The p-type electrode is formed by using Pd of thickness 7 nm for light-transmissive electrode 606 and by using Au which is vapor-deposited for p-type electrode 607. Instead of the material for the light-transmissive electrode, Ni, Pd/Mo, Pd/Pt, Pd/Au or Ni/Au may be used.

In addition, instead of the nitride semiconductor substrate (GaN substrate 600), a pseudo GaN substrate as described above in connection with Embodiment 2 may be used. The nitride semiconductor light-emitting diode grown on the pseudo GaN substrate has characteristics almost similar to those of the device formed on the nitride semiconductor substrate. Moreover, the nitride semiconductor light-emitting diode device may also be formed on a hetero-substrate with a nitride semiconductor buffer layer therebetween.

Embodiment 5

Embodiment 5 is similar to above-discussed embodiments except that the present invention is applied to a nitride semiconductor super-luminescent diode device.

Embodiment 6

According to this embodiment, a nitride semiconductor light-emitting device (nitride semiconductor laser) of the present invention is applied to a semiconductor optical device (e.g. optical pick-up device). The device of the present invention includes a well layer containing at least one element X selected from As, P and Sb. Element X contained in the well layer decreases the effective mass of electrons and holes in the well layer and increases the mobility of electrons and holes. The former means that a carrier inverted population is produced by a small amount of injected current. The latter means that, even if electrons and holes disappear in the light-emitting layer due to radiative recombination of electrons and holes, electrons and holes are newly injected speedily. In other words, as compared with a currently developed InGaN-based nitride semiconductor laser device containing no element X in the well layer, the nitride semiconductor laser device containing element X in the well layer is a semiconductor laser which has a lower threshold current density and is excellent in self-excited lasing characteristics (excellent in noise characteristics). However, the thickness of a well layer which contains element X of conventional laser devices does not allow these advantages to fully be exhibited.

According to the present invention, the thickness of the well layer containing element X is adjusted to achieve a semiconductor laser having these advantages, i.e., reduction of the low threshold current density of the semiconductor laser, a subsequent high power, a prolonged lifetime, and superior noise characteristics. For example, a violet (lasing wavelength: 360 nm–420 nm) nitride semiconductor laser which is produced according to the present invention has a lower lasing threshold current density and more resistant to noise compared with currently developed InGaN-based nitride semiconductor laser. Moreover, the nitride semiconductor laser device according to the present invention can operate in a stable manner with a high power (e.g. 50 mW) and within a high temperature atmosphere (e.g. 60°), and accordingly this laser device is appropriate for an optical disk for high-density recording and reproduction (a lower lasing wavelength allows a higher recording and reproduction density).

Figure 6:
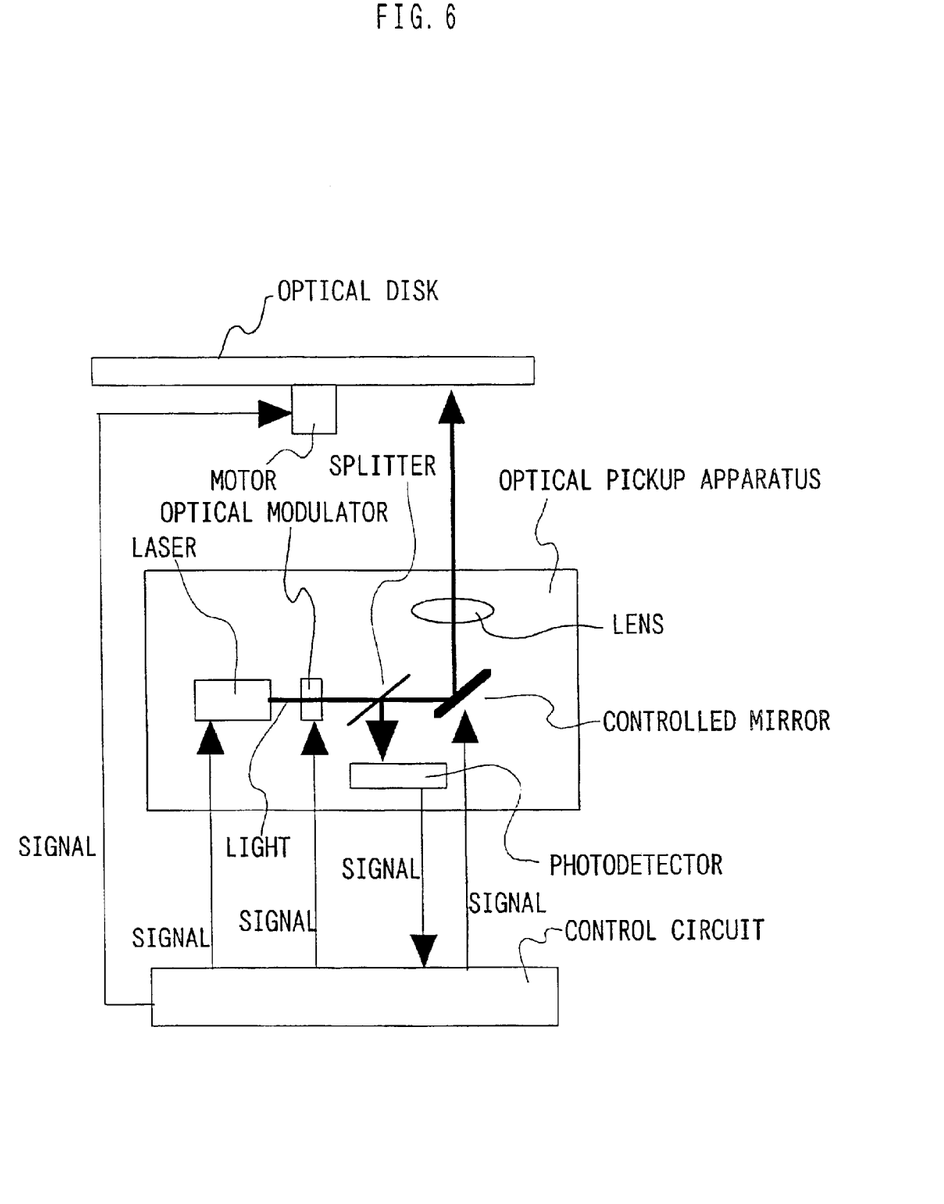
FIG. 6 schematically shows an optical disk device.

FIG. 6 schematically shows an optical pick-up device to which the nitride semiconductor laser device of the present invention is applied. The laser beam shown in FIG. 6 is modulated by an optical modulator according to input information and recorded through a lens on a disk. For reproduction, laser beam optically converted according to the pit arrangement on the disk is detected through a splitter by an optical sensor and accordingly a reproduction signal is generated. This operation is controlled by a control circuit. Generally, the laser output is 30 mW in recording and approximately 5 mW in reproduction.

The nitride semiconductor laser device of the present invention is also applicable not only to the optical disk but also a semiconductor optical apparatus like a laser printer, a barcode reader, and projector for example.

Embodiment 7

According to this embodiment, the nitride semiconductor light-emitting device (nitride semiconductor light-emitting diode device) is applied to a semiconductor light-emitting apparatus (e.g. display apparatus and white light source apparatus).

The nitride semiconductor light-emitting diode device according to the present invention is applicable to a display device used for at least one of the three primary colors (red, green, blue) of light. In addition, the nitride semiconductor light-emitting diode device is used as one light-emitting diode using the three primary colors of light, and may be used as a white light source apparatus. Alternatively, a white light source display apparatus is produced by applying fluorescent coating to the nitride semiconductor light-emitting diode device of the present invention with the emission wavelength ranging from the ultraviolet wavelengths to violet wavelengths (approximately 360 nm–440 nm). This white light source display apparatus may be used, instead of the halogen light source used for conventional liquid crystal display, as a backlight with a low consumption power and a high luminance. Accordingly, the device can be used for a portable notebook personal computer, and a backlight for a liquid crystal display of a man-machine interface by means of a mobile telephone, and accordingly a small-sized and high-contrast liquid crystal display can be provded.

As heretofore discussed, according to the present invention, the nitride semiconductor light-emitting device has a reduced threshold current density or an enhanced emission intensity. Such a light-emitting device is thus appropriate for various optical devices and light-emitting apparatus.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride semiconductor light-emitting device comprising:

a substrate;

an n-type nitride semiconductor layer and a p-type nitride semiconductor layer formed on said substrate; and one or a plurality of well layers and one or a plurality of barrier layers of GaN provided between said n-type nitride semiconductor layer and said p-type nitride semiconductor layer, wherein said well layer is constituted of nitride semiconductor containing at least N and element X including at least one element selected from the group consisting of As, P and Sb, said nitride semiconductor of said well layer has at most 30% in atomic percent represented by expression $\{Nx/(N_N+Nx)\} \times 100$ where Nx represents the number of atoms of said element X and $N_N$ represents the number of atoms of said N, and said well layer has a thickness ranging from 0.4 nm to 4.8 nm.

2. The nitride semiconductor light-emitting device according to claim 1, wherein said well layer contains at least one element selected from the group consisting of Si, O, S, C, Ge, Zn, Cd and Mg in a concentration ranging from $1 \times 10^{17}/cm^3$ to $1 \times 10^{19}/cm^3$.

3. The nitride semiconductor light-emitting device according to claim 1, wherein the number of said well layers is at most 8.

4. The nitride semiconductor light-emitting device according to claim 1, wherein said substrate is a nitride semiconductor substrate.

5. The nitride semiconductor light-emitting device according to claim 1, wherein said substrate is a pseudo nitride semiconductor substrate.

6. An optical device including the nitride semiconductor light-emitting device according to claim 1.

7. A light-emitting apparatus including the nitride semiconductor light-emitting device according to claim 1.

8. A nitride semiconductor light-emitting device comprising:

a substrate;

an n-type nitride semiconductor layer and a p-type nitride semiconductor layer formed on said substrate; and one or a plurality of well layers and one or a plurality of barrier layers of GaN provided between said n-type nitride semiconductor layer and said p-type nitride semiconductor layer, wherein said well layer is constituted of nitride semiconductor containing at least N and element X including at least one element selected from the group consisting of As, P and Sb, said nitride semiconductor of said well layer has at most 30% in atomic percent represented by expression $\{Nx/(N_N+Nx)\} \times 100$ where Nx represents the number of atoms of said element X and $N_N$ represents the number of atoms of said N, said well layer has a thickness ranging from 0.4 nm to 4.8 nm; and said barrier layer has its thickness equal to or greater than that of said well layer.

9. The nitride semiconductor light-emitting device according to claim 8, wherein said barrier layer has its thickness at least 1.5 times as large as that of said well layer.

10. A nitride semiconductor light-emitting device comprising:

a substrate;

an n-type nitride semiconductor layer and a p-type nitride semiconductor layer formed on said substrate; and one or a plurality of well layers and one or a plurality of barrier layers of GaN provided between said n-type nitride semiconductor layer and said p-type nitride semiconductor layer, wherein said well layer is constituted of nitride semiconductor containing at least N and element X including at least one element selected from the group consisting of As, P and Sb, said nitride semiconductor of said well layer has at most 30% in atomic percent represented by expression $\{N_x/(N_N+N_x)\} \times 100$ where $N_x$ represents the number of atoms of said element X and $N_N$ represents the number of atoms of said N, said well layer has a thickness ranging from 0.4 nm to 4.8 nm; and said barrier layer has its thickness ranging from 3.2 nm to 17 nm.

* * * * *